United States Patent [19]

Fukui

[11] Patent Number: 4,875,139

[45] Date of Patent: Oct. 17, 1989

[54] BUILDING BLOCK LSI

[75] Inventor: Masahiro Fukui, Matsubara, Japan

[73] Assignee: Matsushita Electric Industrial Co., Ltd., Osaka, Japan

[21] Appl. No.: 131,006

[22] Filed: Dec. 10, 1987

[30] Foreign Application Priority Data

Dec. 16, 1986 [JP] Japan ................................. 61-299482

[51] Int. Cl.[4] ............................................. H05K 1/18
[52] U.S. Cl. ..................................... 361/410; 361/393; 361/428
[58] Field of Search ............... 361/393, 394, 396, 400, 361/401, 406, 409, 410, 413, 414, 416, 426, 428

[56] References Cited

U.S. PATENT DOCUMENTS

| | | | |
|---|---|---|---|
| 4,489,364 | 12/1984 | Chance et al. | 361/409 |
| 4,730,238 | 3/1988 | Cook | 361/414 |
| 4,734,825 | 3/1988 | Peterson | 361/394 |

OTHER PUBLICATIONS

M. Fukui et al., "A New Block Interconnection Algorithm for VLSI Layout System", Proceedings of ISCAS '85.

Fukui et al., "A Block Interconnection Algorithm for VLSI Algorithm for Hierarchial Layout System", IEEE Transactions on Computer-Aided Design, vol. CAD-6, No. 3, May 1987.

Primary Examiner—A. D. Pellinen
Assistant Examiner—Gregory D. Thompson
Attorney, Agent, or Firm—Wenderoth, Lind & Ponack

[57] ABSTRACT

A building block LSI includes a plurality of circuit blocks and an L-shaped channel formed between adjacent circuit blocks. The L-shaped channel extends in two directions at a first angle. A first set of wires is disposed in the L-shaped channel, extending in a direction parallel to the L-shaped channel. A second set of wires extends at a second angle from the circuit blocks into the L-shaped channel. The second angle is half that of the first angle. The two sets of wires are connected by through-holes such that the circuit blocks are interconnected electrically.

3 Claims, 3 Drawing Sheets

BUILDING BLOCK LSI

BACKGROUND OF THE INVENTION

This invention relates to a building block LSI, and more particularly to a building block LSI in which routing or wiring of the blocks can be easily and effectively carried out.

One example of a building block LSI is a microprocessor LSI. A microprocessor includes various circuit blocks, e.g., data ROM, instruction ROM, sequencer, I/O, ALU, multiplier, etc. These circuit blocks are all formed on the same silicon chip so that a single chip microprocessor LSI is formed. When such a microprocessor LSI is designed or fabricated, effective routing or wiring of the blocks is one of the important factors in obtaining a LSI having a high density.

Conventionally, for interlock routing of the blocks in a building block LSI, the routing area between the blocks is divided into linear or L-shaped channels (bandshaped routing areas), and each channel is sequentially wired from possible ones. The method of dividing the interblock routing area into linear or L-shaped channels, and the method of determining the processing order of the channels to be wired have been already reported (M. Fukui et al., "A New Block Interconnection Algorithm for VLSI Layout System," Proceedings of ISCAS '85; Fukui et al., "A Block Interconnection Algorithm for Hierarchial Layout System," IEEE Transactions on Computer-Aided Design, Vol. CAD-6, No. 3, May 1987). It is possible to divide, in any case, the interblock routing area into linear and L-shaped channels so that the processing order of all the channels may be determined.

the wiring can be guaranteed 100 percent when the wiring processing of the channels is repeated sequentially and completely in the determined processing order.

FIG. 1 is an example of conventional channel routing, in which 1A, 1B are circuit blocks, 2 denotes terminals, 3 is a horizontal line segment, 4 is a vertical line segment, 5 is a through-hole, and 6 is a straight line-shaped channel. The horizontal line segment 3 and vertical line segment 4 are drawn in the mutually isolated separate layers (not shown), and the two layers are connected by opening a through-hole at the intersecting position of the wires, so that a desired wiring is realized. The steps according to this routing method are as follows, step 1: the routing topology of each net (a group of terminals to be wired at the same potential) is determined, step 2: the vertical direction position of each horizontal line segment 3 is determined so that the width of the channel may be minimized as long as the positional constraints between horizontal line segments 3 are satisfied, i.e., satisfying such constraints that a certain horizontal line segment 3 must be located above an other horizontal line segment 3 and that a certain horizontal line segment 3 and another horizontal line segment 3 must be disposed at a certain spacing in the vertical direction, step 3: a vertical line segment 4 is drawn from each terminal 2 to the horizontal line segment 3 to be wired, and a throughhole is opened at the intersection of the horizontal line segment 3 and vertical line segment 4, and the routing is realized. The channel routing method is always 100 percent possible unless the channel width is limited, and its feature lies in that the channel width can be narrowed to the minimum width necessary for routing after completing the routing processing, and effective routing processing is possible. This is possible because the horizontal direction position of the terminals is not changed if the upper and lower circuit blocks of the channel are moved in the vertical direction, so that the routing topology and positional constraints of the horizontal line segments 3 are not changed.

Referring now to FIG. 2, an example of the difficulty encountered in wiring by the conventional channel routing method is illustrated. In the case of an L-shaped channel 6L as shown in FIG. 2, when the circuit block 1A at the upper right corner is moved in the vertical direction, the channel direction position of the terminals at the left side of the circuit block 1A at the upper right corner is changed, or when the circuit block 1A is moved in the lateral or horizontal direction, the channel direction position of the terminals at the lower side of the circuit block 1A is changed. Therefore, wherever the circuit block is moved, the routing topology and positional constraints of horizontal line segments 3 of any one of the nets are changed, and collision of wires occurs, so that the feature (advantage) of the channel routing shown in FIG. 1 is sacrificed.

Therefore, in the convention method of routing by using horizontal and vertical line segments, in the case of routing in an L-shaped channel area, it is not possible to make the wiring having a minimum channel width.

SUMMARY OF THE INVENTION

It is hence a primary object of this invention to present a building block LSI which is capable of routing efficiently, allowing the movement of a circuit block 1 without changing the routing topology in the case of and L-shaped channel area routing, as well as in the case of straight channel routing.

This and other objects are accomplished by a building block LSI for forming routes by drawing, in a routing area enclosed by two L-shaped sides having terminals on the sides, a line segment in the direction along said L-shape and a line segment parallel to the middle angle direction of L-shaped angle in mutually insulated separate two layers, and connecting them by opening a through-hole in the insulated layers at the intersecting position of wires of said two layers.

While the novel features of the invention are set forth with particularity in the appended claims, this invention, both as to organization and content, will be better understood and appreciated, along with other objects and feature thereof, from the following detailed description taken in conjunction with the drawings.

DETAILED DESCRIPTION OF THE INVENTION

One of the embodiments of this invention is described below while referring to FIG. 3.

Figure 1:
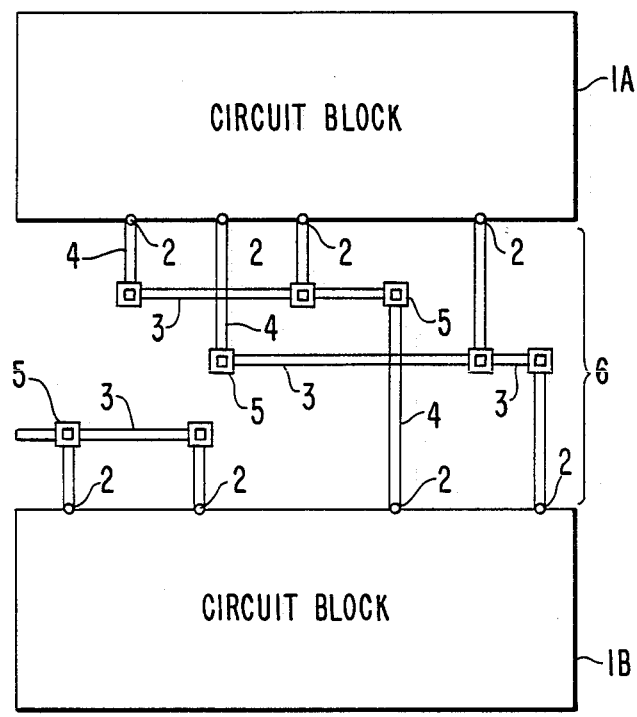
FIGS. 1 and 2 are routing diagrams of building block LSI configurations of the prior art.
Figure 2:
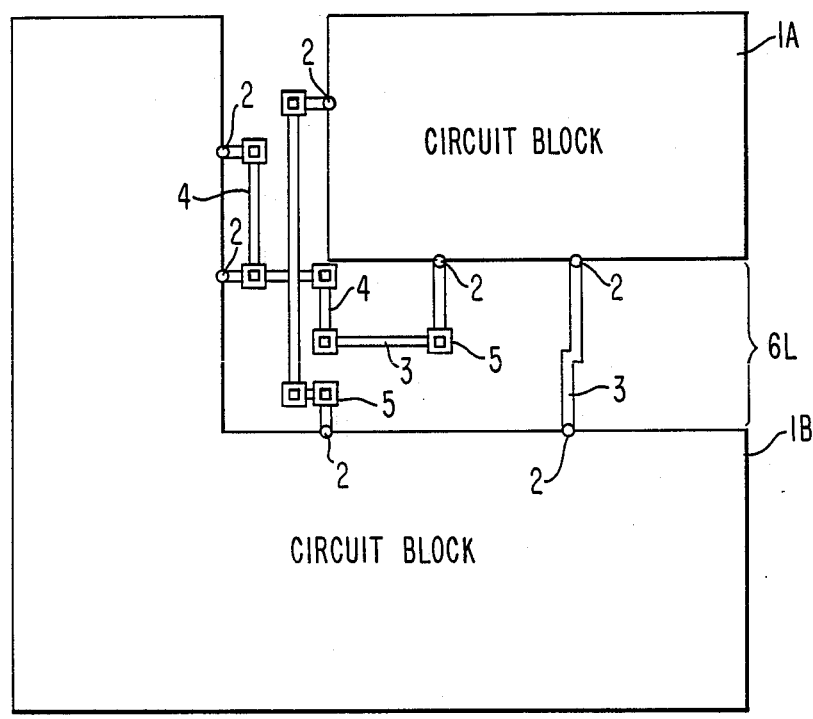
Figure 3:
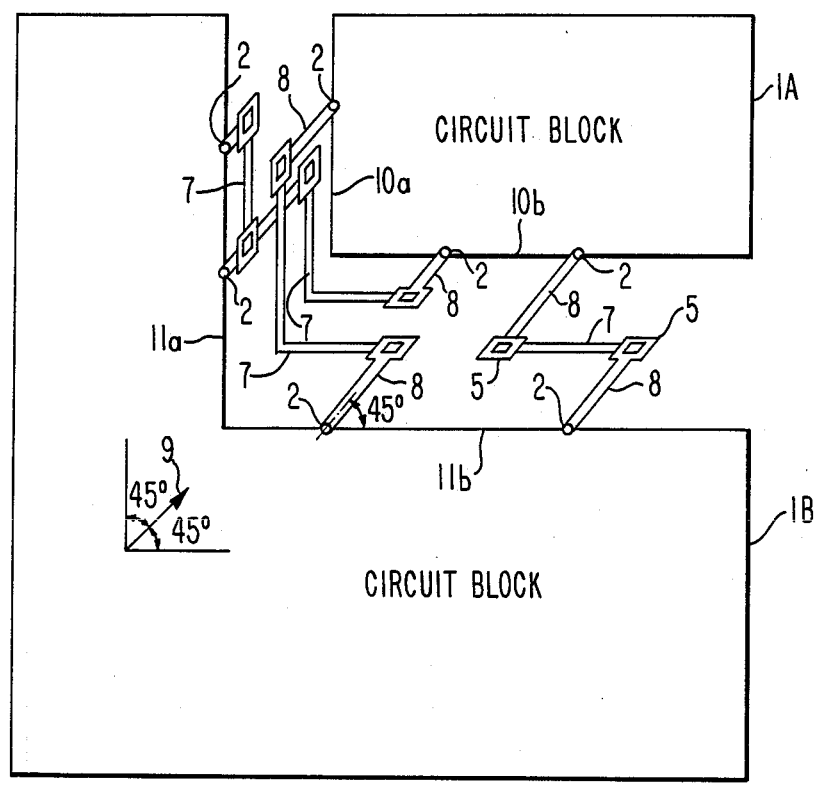
FIG. 3 is a routing diagram of a semiconductor integrated circuit according to one of the embodiments of this invention.

FIG. 3 shows an embodiment of this invention, in which 1A, 1B are circuit blocks (1A is a rectangular circuit block and 1B is an L-shaped circuit block), 2 denotes their terminals, 7 denotes the L-shaped-direction wires (the wire in the direction along the shape of the L-shaped channel 6L), 8 indicates the middle angle direction wires (the wire parallel to the middle angle direction of the L-shaped angle), and 9 represents the middle angle direction of the L-shaped angle. In this embodiment, the L-shaped angle is 90° and the middle angle is in a direction 45° from the direction of the L-shaped channel 6L, which is the Lletter-shaped area located between L-letter-shaped line 10a–10b of block 1A and L-letter-shaped line 11a–11b of block 1B wherein line 11a–11b is parallel to line 10a–10b. The L-shape-direction wires 7 in the direction along the L-shape of the channel, and the middle angle wires 8 parallel to the middle angle direction of the L-shaped angle area respective drawn in two layers, and they are connected by opening a through-hole 5 in the intersecting position of wires of the two layers (not shown), so that the routing path is formed. When such a routing path is formed, if the upper right circuit block 1A is moved in the middle angle direction 9 of the L-shaped angle, the configuration of the wire 7 in the direction along the L-shaped channel and the middle angle direction wire 8, i.e., the routing topology, is not changed. Similarly, the positional constraints in the L-shaped angle middle angle direction 9 of two routings in the direction along the L-shaped channel are also not changed. Accordingly, when the middle angle direction 9, the L-shaped direction routing 7, and the middle angle direction routing 8 are caused to correspond respectively to the vertical direction, horizontal line segment 3, and vertical line segment 4 of the straight channel in the prior art shown in FIG. 1, efficient routing processing can also be realized in the L-shaped channel, as in the linear channel, by the same routing method comprising steps 1 to 3 in the routing method of a straight channel. In FIG. 3, the L-shaped angle and the middle angle are shown as 90° and 45°, respectively, but the angles may be set arbitrarily (e.g., 60° and 30°)

While specific embodiments of the invention have been illustrated and described herein, it is realized that modifications and changes will be apparent to those skilled in the art. It is therefore to be understood that the appended claims are intended to cover all modifications and changes as fall within the true spirit and scope of the invention.

We claim:

1. A building block LSI comprising:
    a plurality of circuit blocks;
    an L-shaped channel formed between adjacent said circuit blocks, said L-shaped channel extending in two different directions from a corner portion of said L-shaped channel, and said two different directions defining a first angle therebetween;
    a first set of wires disposed in said L-shaped channel and extending in said different directions;
    a second set of wires extending at a second angle from said circuit blocks into said L-shaped channel, said second angle being half that of said first angle;
    wherein said first set of wires and said second set of wires are connected such that said adjacent circuit blocks are interconnected electrically.

2. A building block LSI as claimed in claim 1, wherein said first angle is 90.

3. A building block LSI as claimed in claim 1, wherein said first and second sets of wires are connected to each other by through-holes.

* * * * *